United States Patent
Daigle et al.

(10) Patent No.: US 10,574,194 B2
(45) Date of Patent: Feb. 25, 2020

(54) AMPLIFIER WITH LOCAL FEEDBACK LOOP

(71) Applicant: SEMICONDUCTOR COMPONENTS INDUSTRIES, LLC, Phoenix, AZ (US)

(72) Inventors: Tyler Daigle, Scarborough, ME (US); Hrvoje Jasa, Scarborough, ME (US); Andrew Jordan, Scarborough, ME (US); Gregory Maher, Cape Elizabeth, ME (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/514,650

(22) Filed: Jul. 17, 2019

(65) Prior Publication Data

US 2019/0372531 A1    Dec. 5, 2019

Related U.S. Application Data

(63) Continuation of application No. 15/993,063, filed on May 30, 2018, now Pat. No. 10,396,724.

(51) Int. Cl.
| | |
|---|---|
| *H03F 1/34* | (2006.01) |
| *H03F 3/187* | (2006.01) |
| *H03F 3/21* | (2006.01) |
| *H03F 3/45* | (2006.01) |
| *H03F 3/217* | (2006.01) |

(52) U.S. Cl.
CPC .............. *H03F 1/34* (2013.01); *H03F 3/187* (2013.01); *H03F 3/211* (2013.01); *H03F 3/217* (2013.01); *H03F 3/45479* (2013.01); *H03F 2200/03* (2013.01); *H03F 2200/129* (2013.01); *H03F 2200/156* (2013.01); *H03F 2200/171* (2013.01); *H03F 2200/21* (2013.01); *H03F 2200/471* (2013.01); *H03F 2200/481* (2013.01); *H03F 2203/21157* (2013.01); *H03F 2203/45151* (2013.01); *H03F 2203/45528* (2013.01)

(58) Field of Classification Search
CPC ........................................................ H03F 1/34
See application file for complete search history.

(56) References Cited

U.S. PATENT DOCUMENTS

| | | | |
|---|---|---|---|
| 5,206,602 A | | 4/1993 | Baumgartner et al. |
| 5,559,470 A | * | 9/1996 | Laber ................. H03H 11/0466 330/252 |
| 5,914,638 A | | 6/1999 | He |

(Continued)

*Primary Examiner* — Patricia T Nguyen
(74) *Attorney, Agent, or Firm* — Brake Hughes Bellermann LLP

(57) ABSTRACT

In a general aspect, a circuit can include an amplifier circuit including a first amplifier, a first feedback path, and a second feedback path. The first feedback path can provide a feedback path from a positive output of the first amplifier to a negative input of the first amplifier. The second feedback path can provide a feedback path from a negative output of the first amplifier to a positive input of the first amplifier, The circuit can also include a loop circuit including a second amplifier, The loop circuit can be configured to provide a local feedback loop for the first amplifier and configured to control current flow into the positive input of the first amplifier and into the negative input of the first amplifier.

20 Claims, 9 Drawing Sheets

(56) References Cited

U.S. PATENT DOCUMENTS

| | | | |
|---|---|---|---|
| 6,480,128 B1* | 11/2002 | Bach | G11C 27/02 327/96 |
| 6,784,698 B1* | 8/2004 | Brenden | H03F 3/3062 327/51 |
| 6,946,890 B1* | 9/2005 | Lei | H03F 3/45946 327/310 |
| 8,604,861 B1 | 12/2013 | Ceballos et al. | |
| 10,110,175 B1* | 10/2018 | Abdelfattah | H03F 1/3247 |
| 2007/0290757 A1* | 12/2007 | Gilbert | H03F 1/26 330/278 |
| 2009/0115522 A1 | 5/2009 | Lyden et al. | |
| 2009/0179699 A1 | 7/2009 | Higuchi | |
| 2013/0169361 A1 | 7/2013 | Killat | |
| 2013/0223652 A1 | 8/2013 | Sahandiesfanjani et al. | |
| 2017/0019078 A1 | 1/2017 | Galal | |
| 2017/0077882 A1 | 3/2017 | Wang et al. | |
| 2018/0055409 A1 | 3/2018 | Xu | |

* cited by examiner

| Chop Clock | Effective Frequency | THD | Noise | PSRR |
|---|---|---|---|---|
| amp_clk/2 | FREQ_A/2 | ✓ | | ✓ |
| amp_clk | FREQ_A | ✓ | | |
| amp_clk*2 | 2*FREQ_A | | | ✓ |
| cmp_1st_edge | FREQ_A | ✓ | | |
| cmp_1st_edge XOR amp_clk/2 | (3*FREQ_A)/2 | ✓ | ✓ | ✓ |

✓ – Result not affected

FIG. 3

AMPLIFIER WITH LOCAL FEEDBACK LOOP

CROSS-REFERENCE TO RELATED APPLICATIONS

This application is a continuation of and claims the benefit of U.S. patent application Ser. No. 15/993,063, filed on May 30, 2018, now U.S. Pat. No. 10,396,724, the entire contents of which is incorporated herein by reference.

TECHNICAL FIELD

This description generally relates to fully differential amplifiers, such as class D amplifiers.

BACKGROUND

In general, a fully differential amplifier can be a DC-coupled high-gain electronic voltage amplifier that accepts a differential input voltage and produces a differential output voltage. The output of the fully differential amplifier can be controlled by two feedback paths, one feedback path on the positive voltage input and another feedback path on the negative input voltage path. In most cases, due to the high gain of the amplifier, each feedback path can play a significant part in determining the output differential voltage for any given input differential voltage. Resistor mismatches in the feedback paths can adversely affect the performance of the fully differential amplifier.

SUMMARY

In a general aspect, a circuit can include an amplifier circuit including a first amplifier, a first feedback path, and a second feedback path. The first feedback path can provide a feedback path from a positive output of the first amplifier to a negative input of the first amplifier. The second feedback path can provide a feedback path from a negative output of the first amplifier to a positive input of the first amplifier, The circuit can also include a loop circuit including a second amplifier, The loop circuit can be configured to provide a local feedback loop for the first amplifier and configured to control current flow into the positive input of the first amplifier and into the negative input of the first amplifier.

The details of one or more implementations are set forth in the accompanying drawings and the description below. Other features will be apparent from the description and drawings, and from the claims.

BRIEF DESCRIPTION OF THE DRAWINGS

FIG. 3 is an example chart that shows the effect of frequency of a chop clock on a total harmonic distortion (THD), an out-of-band noise, and a power supply rejection ratio (PSRR) for a fully differential amplifier circuit.

Like reference symbols in the various drawings indicate like elements.

DETAILED DESCRIPTION

In a fully differential amplifier circuit that includes circuitry for performing front end signal filtering and/or that includes circuitry for performing digital signal processing, there can be a common mode shift from an input common mode voltage to an output common mode voltage. In some implementations, the fully differential amplifier circuit can include a Class D amplifier. A common mode loop circuit that includes chopper switches clocked at a variable frequency, and variable duty cycle rate can be placed at (coupled with, connected to, etc.) the differential input to the Class D amplifier, providing a local feedback loop that drives the common mode shift across input resistors to the amplifier to a fixed value. This can significantly reduce the power supply rejection ratio (PSRR) dependence on resistor value mismatch between the input resistors without impacting the performance of the Class D amplifier, resulting in an increased PSRR for the fully differential amplifier.

Figure 1A:
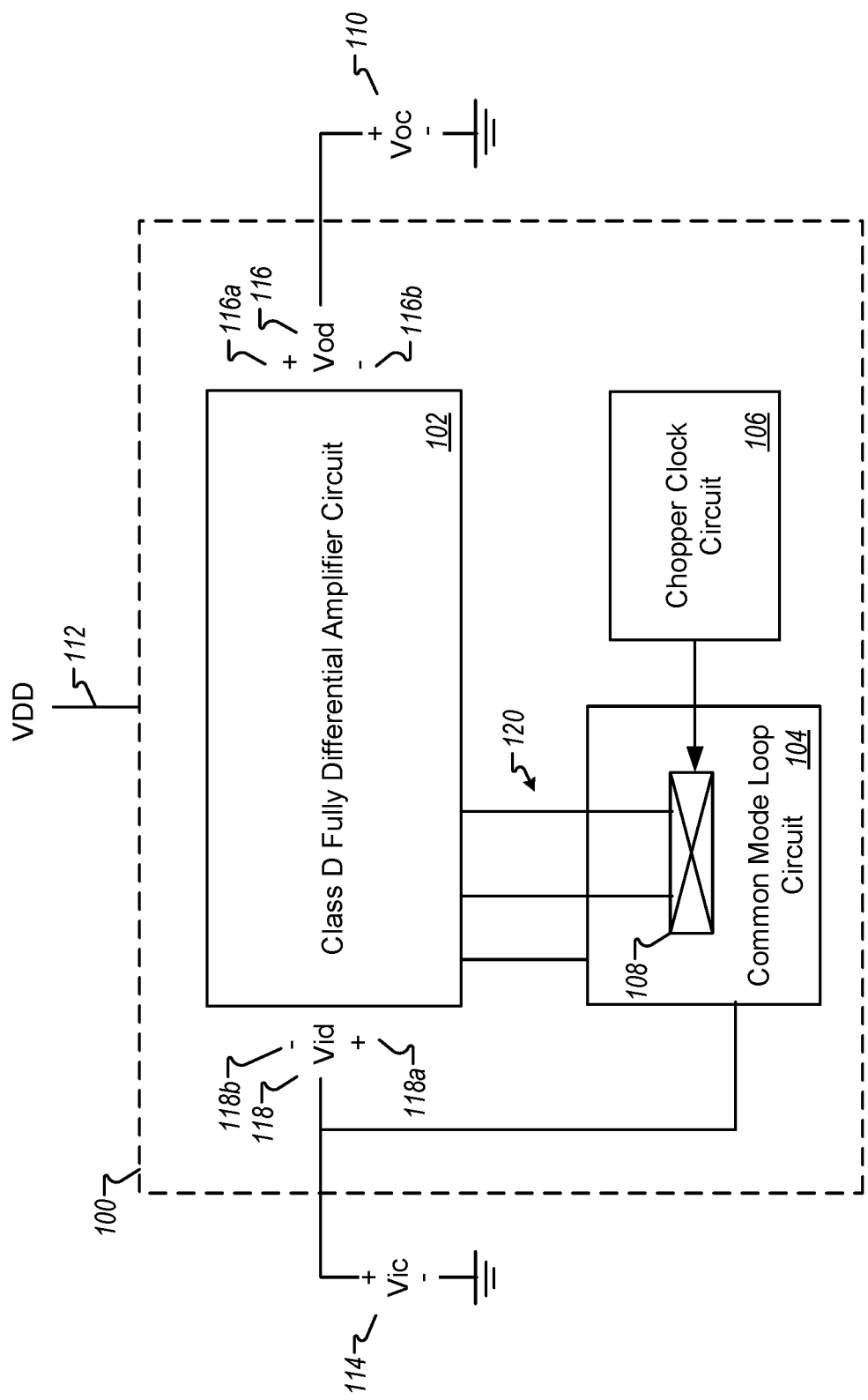
FIG. 1A is a block diagram of an example circuit that includes a fully differential amplifier circuit, a common mode (CM) loop circuit, and a chopper clock circuit.

FIG. 1A is a block diagram of an example circuit 100 that includes a fully differential amplifier circuit 102 (that can also be referred to herein as amplifier 102), a common mode (CM) loop circuit 104, and a chopper clock circuit 106. The CM loop circuit 104 includes chopper switches 108, which can also be referred to herein as a chopper circuit 108. In some implementations, the amplifier 102 can be an audio amplifier. In some implementations, the amplifier 102 can be a class D amplifier. The example circuit 100 can also be referred to as a system.

In some implementations, utilizing a fully differential amplifier, in order to increase (e.g., maximize, etc.) an amplitude of an output differential mode voltage (Vod 116) of the amplifier 102, an output common mode voltage (Voc 110) can be centered at a value that is one-half of a power supply voltage, VDD 112. For example, the Voc 110 can be centered at VDD 112 divided by two. An input common mode voltage (Vic 114) can be independent of the power supply voltage, VDD 112. The output differential mode voltage (Vod 116) of the amplifier 102 can be controlled by two feedback paths, a first feedback path on a positive voltage input (Vid(+) 118a) to the amplifier 102 and a second feedback path on a negative input voltage path (Vid(−) 118b) of the amplifier 102, which is shown in more detail in FIG. 1B.

If either the output common mode voltage (Voc 110) or the input common mode voltage (Vic 114) is dependent on the power supply voltage (VDD 112), a common mode voltage to differential mode voltage conversion can be dependent on the power supply voltage (VDD 112). Therefore, a mismatch or difference in the feedback provided by the two feedback paths can result in a decrease in a power supply rejection ratio (PSRR) for the amplifier 102, negatively impacting the performance of the amplifier 102 because the ability of the amplifier 102 to minimize the impact of power supply variation on the output differential mode voltage (Vod 116) is reduced.

The common mode loop circuit 104 can provide a common mode loop output stage 120 that can reduce (or in some cases eliminate) the dependency of the Voc 110 on VDD 112, limiting the power supply dependent aspect of the common mode voltage to differential mode voltage conversion to the mismatch of the feedback resistors included in the feedback paths. In addition, the common mode loop output stage 120 can be chopped using the chopper switches 108 in order to reduce (or in some cases eliminate) the mismatch of the feedback resistors included in the feedback paths. The chopper clock circuit 106 can provide a variable frequency, variable duty cycle clock signal to the chopper switches 108. The use of a variable frequency, variable duty cycle clock signal to clock the chopper switches 108 can also reduce flicker noise contributions by elements of the common mode loop circuit 104 (e.g. an amplifier, and/or one or more transistors). The reduction in the flicker noise and the dependency on the mismatch of the feedback resistors included in the feedback paths in the common mode voltage to differential mode voltage conversion by the amplifier 102 can occur without adversely affecting folded out-of-band noise (e.g., folded out-of-band noise will not increase), or without adversely affecting a total harmonic distortion (THD) for the amplifier 102.

For example, in the case of the amplifier 102 being an audio amplifier, out-of-band noise can be noise that is included in frequencies outside of the audio band (e.g., 20 hertz (Hz.) to 20 kilohertz (kHz.)). In some implementations, the amplifier 102 can alias an input signal resulting in the out-of-band noise being folded back into the audio band. The reduction in the flicker noise and the dependency on the mismatch of the feedback resistors included in the feedback paths in the common mode voltage to differential mode voltage conversion by the amplifier 102 can occur without increasing an amount (if present) of folded out-of-band noise for the amplifier 102 in the circuit 100.

For instance, further in the case of the amplifier 102 being an audio amplifier, THD can represent a percentage of harmonic distortion or deviation of between Vod 116 and Vid 118. Reduction in flicker noise and dependency on mismatch of the feedback resistors included in the feedback paths in common mode voltage to differential mode voltage conversion by the amplifier 102 can occur without increasing the THD for the amplifier 102.

Figure 1B:
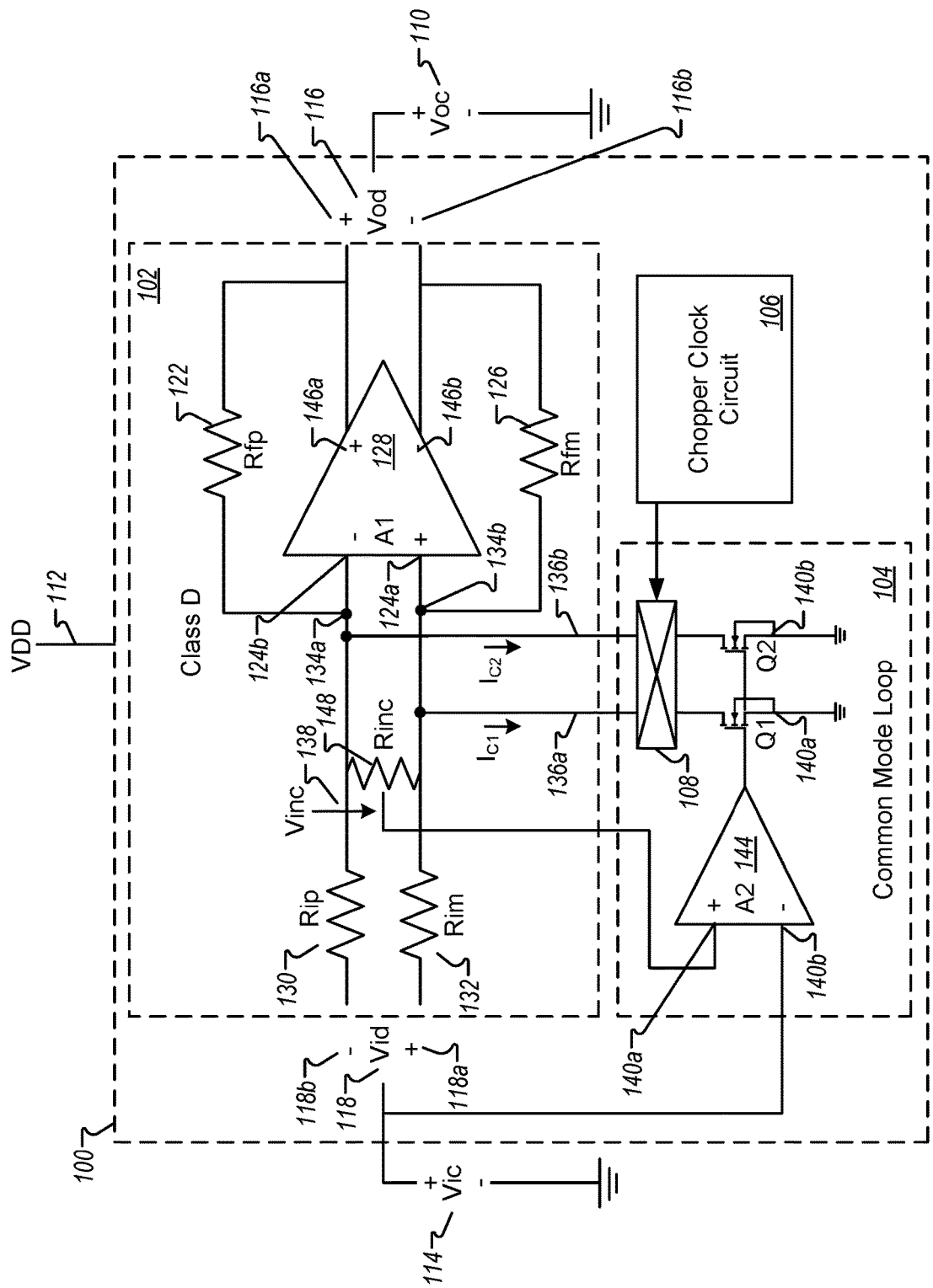
FIG. 1B is a block diagram of an example circuit that shows circuitry included in a fully differential amplifier circuit and a common mode loop circuit.
Figure 2A:
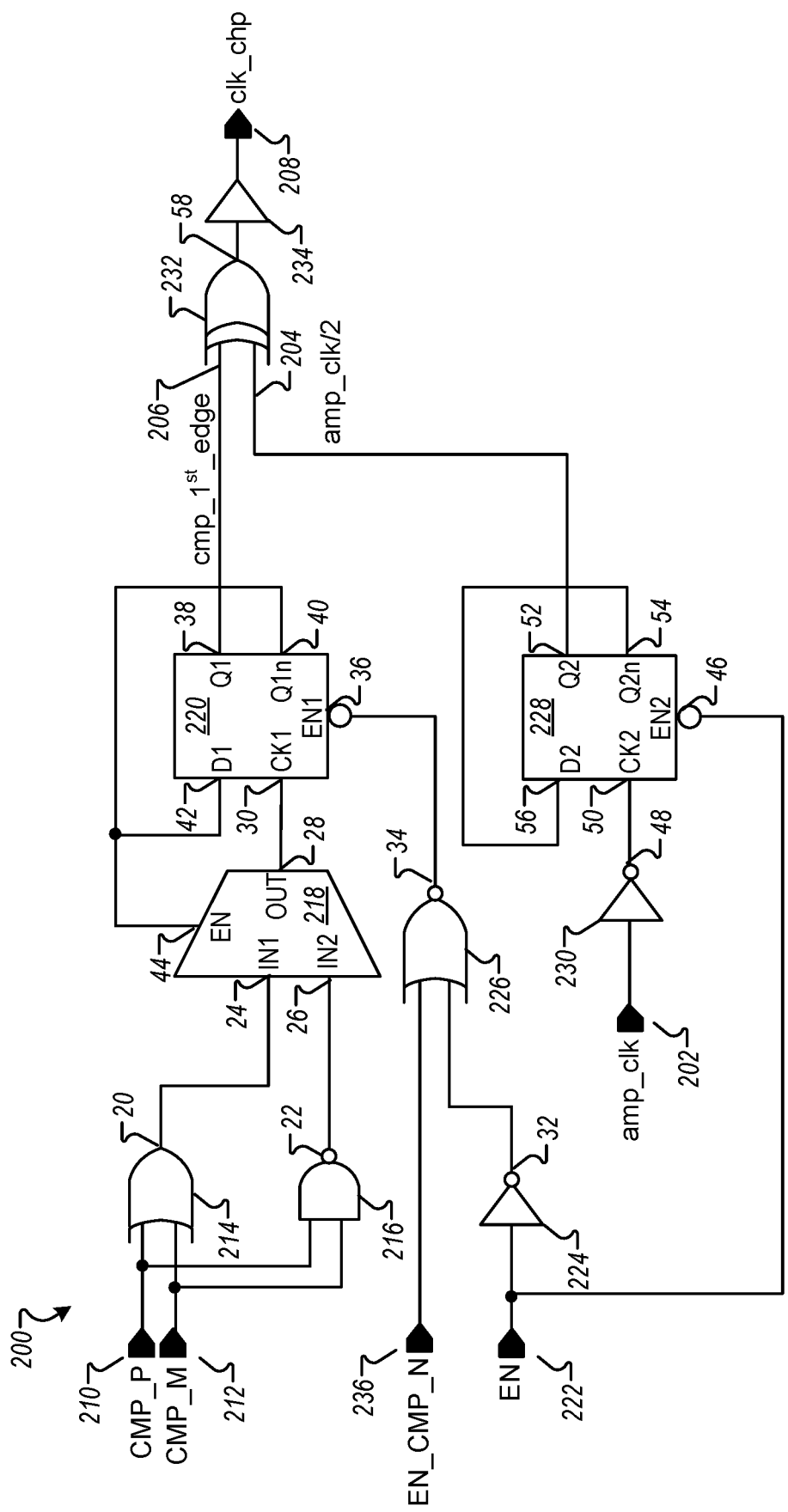
FIG. 2A is a schematic diagram of an example circuit for use as a chopper clock circuit.

FIG. 1B is a block (and schematic) diagram of the example circuit 100 that shows circuitry included in the amplifier circuit 102 and the common mode loop circuit 104. Circuitry that can be included in the chopper clock circuit is shown in FIG. 2A and discussed below.

Feedback resistor Rfp 122 provides feedback from a positive voltage output (Vod(+) 116a) to a negative input 124b of an amplifier A1 128. In some implementations, the amplifier 128 can be a class D amplifier. Feedback resistor Rfm 126 provides feedback from a negative voltage output (Vid(−) 116b) to a positive input 124a of the amplifier A1. The feedback resistor Rfp 122 and the feedback resistor Rfm 126 are connected to (coupled to) an input resistor Rip 130 and an input resistor Rim 132, at node 134a and node 134b, respectively. The input resistor Rim 132 and the input resistor Rip 130 are also connected to the positive input 124a and the negative input 124b, respectively, of the amplifier A1 128. An output 136a and an output 136b from the chopper switches 108 is connected to the positive input 124a and the negative input 124b, respectively, of the amplifier A1 128. The amplifier 128 provides a positive output signal 146a and a negative output signal 146b that will be described in more detail with reference to FIGS. 2B-C.

In some implementations, a value of the input resistor Rim 132 can be equal to a value of the input resistor Rip 130. A mismatch or difference between the value of the input resistor Rim 132 and the value of the input resistor Rip 130 can be based on variations in the fabrication of each resistor. In some implementations, a value of the feedback resistor Rfp 122 can be equal to a value of the feedback resistor Rfm 126. A mismatch or difference between the value of the feedback resistor Rfp 122 and the feedback resistor Rfm 126 can be based on variations in the fabrication of each resistor.

The common mode loop circuit 104 can drive a common mode shift across each of the input resistors, the input resistor Rip 130 and the input resistor Rim 132, to a fixed value. For example, an amplifier A2 144 can be included in a local feedback loop for the amplifier 128. The local feedback loop can include the amplifier A2 144, a transistor Q1 140a, a transistor Q2 140b, and the chopper switches 108. The amplifier A2 144 can force (drive, provide, etc.) a common mode voltage at the input terminals of the amplifier A1 128 (a voltage Vinc 138) to be equal to a constant voltage that is independent of the power supply voltage VDD 112 (e.g., the input common mode voltage Vic 114). As shown in FIG. 1B, the input common mode voltage Vic 114 is input to a negative input 140b of the amplifier A2 144. The voltage Vinc 138 is input to a positive input 140a of the amplifier A2 144. The voltage Vinc 138 can be measured across a resistor Rinc 148.

In some implementations, driving a common mode shift across each of the input resistors to a fixed value can reduce or eliminate the PSRR dependence on the mismatch (or difference between) the input resistors, the input resistor Rip 130 and the input resistor Rim 132, increasing the PSRR for the amplifier 102, which can positively impact performance of the amplifier 102 because the ability of the amplifier 102 to minimize the impact of power supply variation on the output differential mode voltage (Vod 116) is increased or improved.

In some implementations, providing a local feedback loop in the amplifier 102 that can drive a common mode shift across each of the input resistors, the input resistor Rip 130 and the input resistor Rim 132, to a fixed value can decrease input resistor area requirements. For example, input resistor area requirements can impact the overall size of the circuit 100. In order to be used in particular products, the circuit 100 may need to be of a particular size. In some implementations, a physical size of each of the input resistor Rip 130 and the input resistor Rim 132 can be increased to reduce the mismatch between the input resistor Rip 130 and the input resistor Rim 132 because the larger a size of each of the resistors, the less mismatch there will be between the resistors.

In some implementations, providing a local feedback loop in the amplifier 102 that can drive a common mode shift across each of the input resistors, the input resistor Rip 130 and the input resistor Rim 132, to a fixed value can keep circuitry for performing front end signal filtering and/or circuitry for performing digital signal processing and/or other types of front end modular circuitry operating with an increase amount of headroom (e.g., operating margin). For example, amplifier headroom can be a measure of how close the input voltage to an amplifier and the output voltage from the amplifier can swing to the supply rails of the input voltage without being distorted.

Referring to FIG. 1B and Equations 1 and 2 below, the PSRR for the amplifier 102 can depend on a mismatch (or a difference in value between) the input resistors, the input resistor Rip 130 and the input resistor Rim 132, and the feedback resistors, the feedback resistor Rfp 122 and the feedback resistor Rfm 126. The mismatch (or difference between) the input resistors, the input resistor Rip 130 and the input resistor Rim 132, and the feedback resistors, the feedback resistor Rfp 122 and the feedback resistor Rfm 126 can cause the PSRR to depend on the power supply voltage VDD 112. In some implementations, the dependence can be based on the common mode shift from the input common mode voltage 114 to the amplifier 102 to the output common mode voltage Voc 110 from the amplifier 102. The common mode shift can cause an input common mode voltage to differential mode output voltage conversion with a resistor mismatch.

$$Vod = \frac{1}{Av+1}(Vic - Voc)\left(\frac{Rfp}{Rip} - \frac{Rfm}{Rim}\right) \quad \text{Equation 1}$$

where Vod=the output differential mode voltage (Vod 116), Av=gain of the amplifier A1 128, Vic=the input common mode voltage (Vic 114), Voc=the output common mode voltage (Voc 110), Rfp=a value of the feedback resistor Rfp 122, Rfm=a value of the feedback resistor Rfm 126, Rip=a value of the input resistor Rip 130, and Rim=a value of the input resistor Rim 132.

For Vic=2.5 volts, Voc=VDD/2 where VDD=12 volts, and Av=10, solving for Equation 1 results in Equation 2.

$$PSRR_{exp} = \quad \text{Equation 2}$$
$$Vod \text{ with respect to } VDD = 45.46E^{-3}\left(\frac{Rfp}{Rip} - \frac{Rfm}{Rim}\right)$$

where Rfp=a value of the feedback resistor Rfp 122, Rfm=a value of the feedback resistor Rfm 126, Rip=a value of the input resistor Rip 130, and Rim=a value of the input resistor Rim 132, and Vod=the output differential mode voltage (Vod 116), which is dependent on VDD.

Therefore, the output differential mode voltage (Vod 116) can be dependent on the output common mode voltage (Voc 110), which is dependent on the power supply voltage VDD 112, and is also dependent on the mismatch between the feedback resistors Rfp 122 and Rfm 126 and the input resistors Rip 130 and Rim 132.

The common mode loop circuit 104 can include an amplifier A2 144 that senses the difference between the input common mode voltage (Vic 114) and the voltage Vinc 138. The voltage Vinc 138 can be the common mode voltage at the positive input 124a and the negative input 124b of the amplifier A1 128. The voltage Vinc 138 can be affected by the IR drop across the input resistor Rip 130 and the input resistor Rim 132.

Based on the sensing by the amplifier A2 144, the common mode loop circuit 104 can provide further control of the common mode voltage at the input terminals of the amplifier A1 128. Use of the common mode loop circuit 104 in the circuit 100 can significantly reduce or eliminate the dependency of the PSRR on a mismatch (or difference between) the input resisters Rip 130 and Rim 132. A voltage supply (VDD 112) dependent IR-drop (voltage drop) across each of the input resistors Rip 130 and Rim 132 can be reduced by an open loop gain of the amplifier A2 144. The power supply (VDD 112) dependent common mode voltage to differential mode voltage conversion by the circuit 100 can be limited to the mismatch (or difference in value between) the feedback resistor Rfp 122 and the feedback resistor Rfm 126 as shown below in Equation 5.

In Equation 3, Equation 4, and Equation 5 an assumption is made that $I_{C1}=I_{C2}$. However, in some implementations, the current $I_{C1}$ may be different than the current $I_{C2}$ based on a mismatch between the transistor Q1 140a and the transistor Q2 140b, and/or based on a mismatch in the amplifier A2 144.

$$Vod = (Vic - Vinc)\left(\frac{Rfp}{Rip} - \frac{Rfm}{Rim}\right) + Ic(Rfm - Rfp) \quad \text{Equation 3}$$

where Vod=the output differential mode voltage (Vod 116), Vic=the input common mode voltage (Vic 114), Vinc=the voltage Vinc 138, Rfp=a value of the feedback resistor Rfp 122, Rfm=a value of the feedback resistor Rfm 126, Rip=a value of the input resistor Rip 130, and Rim=a value of the input resistor Rim 132, and $Ic=I_{C1}=I_{C2}$.

For Vic=2.5 volts, Voc=VDD/2 where VDD=12 volts, and for the Ic of Equation 4, solving for Equation 3 results in Equation 5.

$$I_C = \frac{Vic - Vinc}{Ri} + \frac{Voc - Vinc}{Rf} = \quad \text{Equation 4}$$
$$I_{C1} = \frac{Vic - Vinc}{Rim} + \frac{Voc - Vinc}{Rfm} =$$
$$I_{C2} = \frac{Vic - Vinc}{Rip} + \frac{Voc - Vinc}{Rfp}$$

where Vic=the input common mode voltage (Vic 114), and Vinc=the voltage Vinc 138.

$$PSRR_{exp} = Vod = \frac{Rfm - Rfp}{Rfm + Rfp} \quad \text{Equation 5}$$

where Rfp=a value of the feedback resistor Rfp 122 and Rfm=a value of the feedback resistor Rfm 126.

The above equations assume that the current $I_{C1}$ and the current $I_{C2}$ are equal. However, in some implementations, the current $I_{C1}$ may not be equal to the current $I_{C2}$. As noted above, in some implementations, because of a mismatch (or difference) between the transistor Q1 140a and the transistor Q2 140b, and/or a mismatch in the amplifier A2 144, the current $I_{C1}$ may not be equal to the current $I_{C2}$. The resistor mismatch (or difference) between the input resistor Rip 130 and the input resistor Rim 132 results in the value of the input resistor Rim 132 not being equal to the value of the input resistor Rip 130. The resistor mismatch (or difference) between the feedback resistor Rfm 126 and the feedback resistor Rfp 122 results in the value of the feedback resistor Rfm 126 not being equal to the value of the feedback resistor Rfp 122.

In order to have the current $I_{C1}$ equal to the current $I_{C2}$ so that Equation 5 for the PSRR for the circuit 100 depends on the mismatch (or difference) between the feedback resistor Rfp 122 and the feedback resistor Rfm 126, the chopper switches 108 are included in the output stage of the amplifier A2 144. Use of the chopper switches 108 in the common mode loop circuit 104 can further reduce (and in some cases eliminate) dependency of PSRR on the mismatch between the input resistor Rim 132 and the input resistor Rip 130. By using a variable frequency, variable duty cycle clock generated by the chopper clock circuit 106 to control the switching of the chopper switches 108, the chopper switches 108 can switch the higher value current between the positive input 124a and the negative input 124b of the amplifier A1 128. This switching can keep the current into each of the positive input 124a and the negative input 124b of the amplifier A1 128 essentially equal. Use of a variable frequency, variable duty cycle clock signal as the clock signal for the chopper switches 108 can result in equalizing the current into the positive input 124a and the negative input 124b of the amplifier A1 128 while not adversely affecting the performance of the circuit 100, as described herein. For example, the folded out-of-band noise for the amplifier 102 will not be adversely affected (e.g., the folded out-of-band noise will not increase). For example the total harmonic distortion (THD) for the amplifier 102 will not be adversely affected (e.g., the THD for the amplifier 102 will not increase).

FIG. 2A is a schematic diagram of an example circuit 200 for use as a chopper clock circuit (e.g., the chopper clock circuit 106 as shown in FIGS. 1A-B).

Referring to FIGS. 1A-B along with FIG. 2A, the circuit 200 can generate a clock signal (clk_chp 208) for input to the chopper switches 108. Input signal CMP_P 210 and input signal CMP_M 212 are used to generate the positive voltage output OUT+ 116a 116a and the negative voltage output OUT-116b 116b, respectively. The input signal CMP_P 210 and the input signal CMP_M 212 are input to an OR (OR) gate 214. The input signal CMP_P 210 and the input signal CMP_M 212 are also input to an NAND gate 216. An output of the OR gate 214 (OR gate output 20) and an output of the NAND gate 216 (NAND gate output 22) are provided as inputs (IN1 24 and IN2 26) to a 2:1 multiplexer 218. An output of the 2:1 multiplexer 218 (MUX output 28) is input to the clock input (CK1 30) of a first D flip flop 220.

A first enable signal (EN 222) can be inverted using a first inverter 224. An output of the first inverter 224 (EN inverted signal 32) can be input to a NOR gate (NOR gate 226) along with a second enable signal (EN_CMP_N 236). An output of the NOR gate 226 (NOR output 34) can be input to the first D flip flop 220 as an enable signal (enable EN1 36) for the first D flip flop 220. A non-inverted output of the first D flip flop 220 (Q1 38) is a cmp_1$^{st}$_edge signal 206 that can be used to generate a chopper clock signal (clk_chp 208) for use by the chopper switches 108. An inverted output of the first D flip flop 220 (Qn1 40) can be connected back to an input (D1 42) of the first D flip flop 220 which is also connected to an enable input (enable EN 44) for the 2:1 multiplexer 218.

The first enable signal (EN 222) can also be input to a second D flip flop 228 as an enable signal (enable EN2 46) for the second D flip flop 228. An amplifier clock signal (amp_clk 202) can be inverted using a second inverter 230. An output of the second inverter 230 (amp_clk inverted signal 48) can be input to the clock input (CK2 50) of the second D flip flop 228. A non-inverted output of the second D flip flop 228 (Q2 52) is an amp_clk/2 signal 204 (the amplifier clock signal divided by two) that can be used to generate the chopper clock signal (clk_chp 208) for use by the chopper switches 108. An inverted output of the second D flip flop 228 (Q2N 54) can be connected back to an input (D2 56) of the second D flip flop 228.

In this implementation, the cmp_1$^{st}$_edge signal 206 and the amp_clk/2 signal 204 are input to an exclusive-OR (XOR) gate 232. An output of the XOR gate 232 (XOR gate output 58) can be input to a non-inverting buffer 234 whose output is the chopper clock signal (clk_chp 208) for use by the chopper switches 108.

Figure 2B:
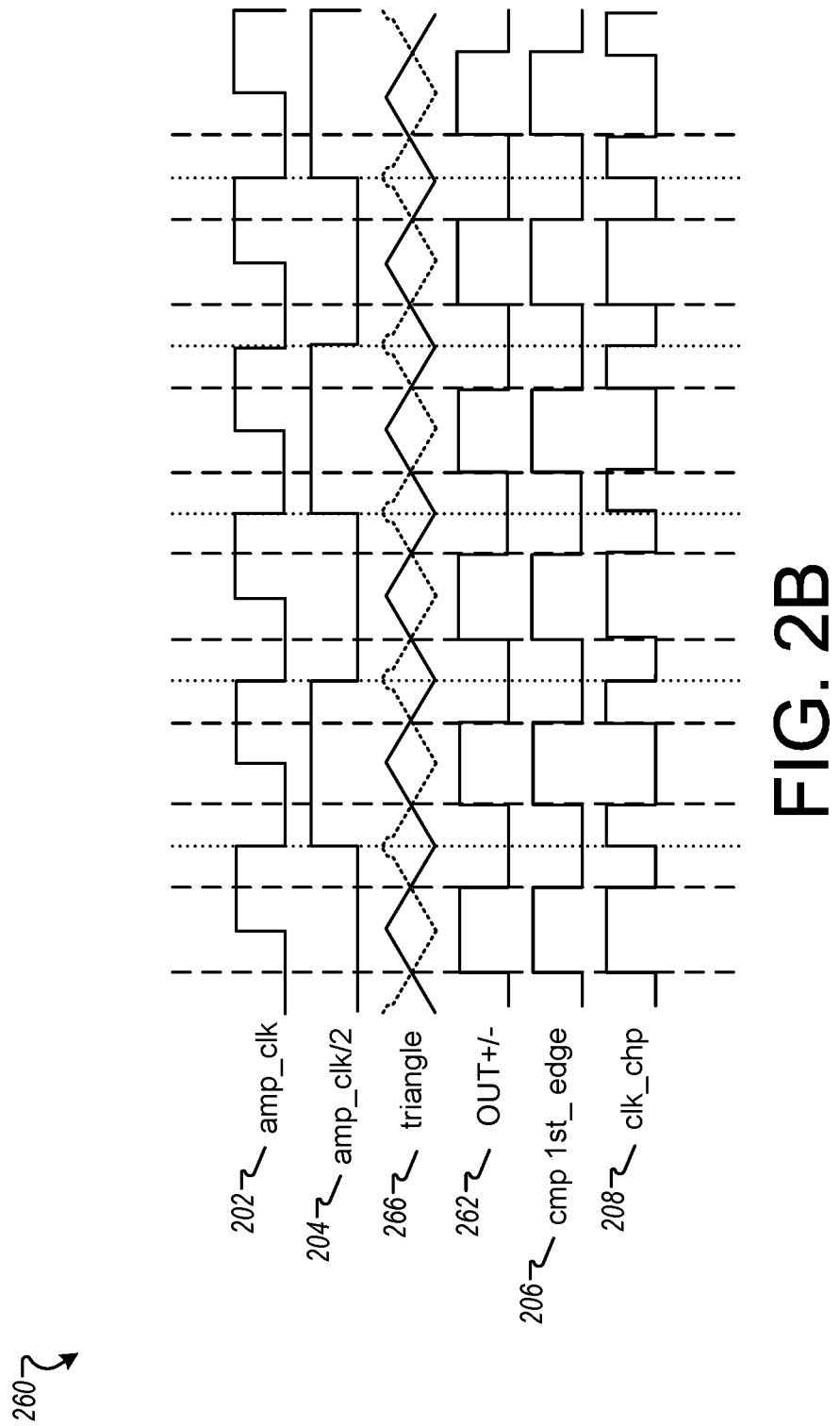
FIG. 2B is an example timing diagram showing output signal waveforms for the example circuit as shown in FIG. 2A when the example circuit as shown in FIG. 1B is outputting signals with low voltage amplitudes.
Figure 2C:
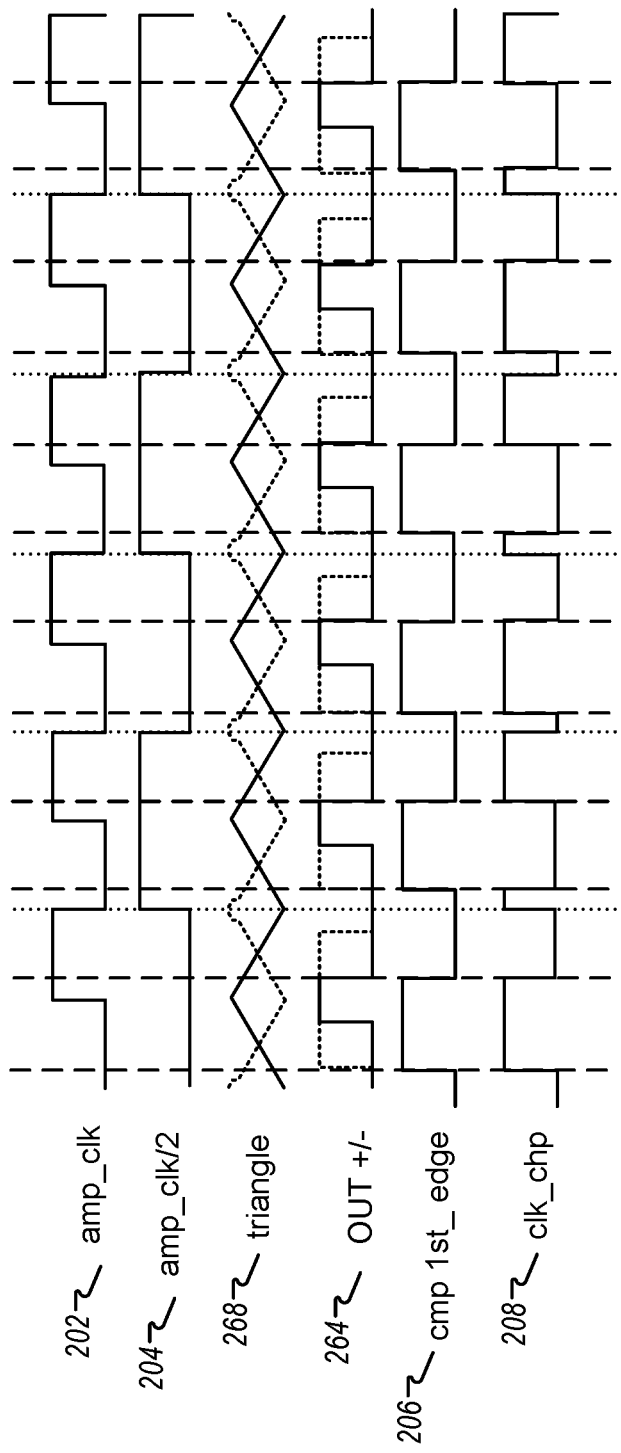
FIG. 2C is an example timing diagram showing output signal waveforms for the example circuit as shown in FIG. 2A when the example circuit as shown in FIG. 1B is outputting signals with high voltage amplitudes.

FIG. 2B is an example timing diagram 260 showing output signal waveforms for the example circuit 200 as shown in FIG. 2A when the circuit 100 as shown in FIGS. 1A-B is outputting signals with low voltage amplitudes. FIG. 2C is an example timing diagram 280 showing output signal waveforms for the example circuit 200 as shown in FIG. 2A when the circuit 100 as shown in FIGS. 1A-B is outputting signals with high voltage amplitudes.

Referring to FIGS. 1A-B, and FIGS. 2A-C, the chopper clock signal (clk_chp 208) is the result of the exclusive-ORing of the cmp_1$^{st}$_edge signal 206 and the amp_clk/2 signal 204 (the amplifier clock signal divided by two). As shown in FIG. 2B and in FIG. 2C, the chopper clock signal (clk_chp 208) transitions with each transition of the cmp_1$^{st}$_edge signal 206 and with each transition of the amp_clk/2 signal 204. Referring to FIG. 2B, the cmp_1$^{st}$_edge signal 206 transitions with each transition of an OUT+/−signal 262. The OUT+/−signal 262 can be the combination of the positive output signal 116a and the negative output signal 116b. Referring to FIGS. 1A-B and FIG. 2B, the OUT+/−signal 262 is produced by the amplifier 102 when the circuit 100 produces a low amplitude signal. Referring to FIGS. 1A-B and FIG. 2C, the OUT+/−signal 264 is produced by the amplifier 102 when the circuit 100 produces a high amplitude signal. For example, in some implementations, a low amplitude signal can be a range of 1 mVrms and a high amplitude signal can be in a range of 1 Vrms.

In some implementations, e.g., where the amplifier 102 is a class D amplifier (e.g., an audio amplifier in some implementations), a triangle signal 266 (in FIG. 2B) represents the sampling frequency for an input audio waveform for the circuit 100 producing the low amplitude signal. In some implementations, e.g., where the amplifier 102 is an audio amplifier, a triangle signal 268 (in FIG. 2C) represents the sampling frequency for an input audio waveform for the circuit 100 producing the high amplitude signal.

As shown in FIGS. 2B-C, an instantaneous duty cycle for the chopper clock signal (clk_chp 208) is variable (changes). However, when averaged over two cycles of the amplifier clock as shown by the amplifier clock signal (amp_clk 202), the duty cycle for the chopper clock signal (clk_chp 208) is 50 percent. The instantaneous duty cycle can be dependent on an amplitude of the signal produced by the circuit 100. In some implementations, as the signal amplitude increases, the closer the instantaneous duty cycle and frequency of the chopper clock signal (clk_chp 208) is to the amplifier clock signal divided by two (amp_clk/2 signal 204).

For example, referring to FIGS. 2A-C, a frequency of the amplifier clock signal (amp_clk 202) can be equal to 646.7 kHz, and a frequency of the amplifier clock signal divided by two, amp_clk/2 signal 204, can be equal to 323.4 kHz. The frequency of the chopper clock signal (clk_chp 208) for use by the chopper switches 108 can be determined by an average frequency of the chopper clock signal (clk_chp 208) over two cycles of the amplifier clock signal (amp_clk 202).

For example, the frequency of the chopper clock signal (clk_chp 208) is equal to (amp_clk*3/2) which is equal to 970.1 kHz.

FIG. 3 is an example chart 300 that shows effects of a frequency of a chop clock used to produce an input signal to chopper switches (e.g., the chopper clock signal (clk_chp 208) generated by the chopper clock circuit 106 for use by the chopper switches 108) on the total harmonic distortion (THD), the out-of-band noise, and the PSRR for the amplifier 102 as shown in FIG. 1B. In the example chart 300, effective frequencies of various signals described herein are based on a frequency of the amp_clk signal 204, which is referred to a FREQ_A in FIG. 3. In some implementations, the amp_clk signal (FREQ_A) can be in a range of, e.g., 100 kHz to 10 MHz.

Referring further to FIGS. 2A-C and row 302 in the example chart 300, when the chop clock has an effective frequency of the amplifier clock signal divided by two (amp_clk/2 signal 204, which in this example is shown equal to FREQ_A/2) the THD and PSRR of the amplifier 102 are not adversely effected. Referring to row 304 in the example chart 300, when the chop clock has an effective frequency of the amplifier clock signal (amp_clk 202, which in this example is shown equal to FREQ_A) the THD of the amplifier 102 is not adversely affected. Referring to row 306 in the example chart 300, when the chop clock has an effective frequency of the amplifier clock signal multiplied by two (amp_clk*2, which is shown equal to 2*FREQ_A) the PSRR of the amplifier 102 is not adversely effected. Referring to row 308 in the example chart 300, when the chop clock has an effective frequency equal to the cmp_1$^{st}$_edge signal 206, which is shown to have a frequency equal to FREQ_A) the THD of the amplifier 102 is not adversely effected. Referring to row 310 in the example chart 300, when the chop clock has an effective frequency equal to the chopper clock signal clk_chp 208, which is shown as being equal to cmp_1$^{st}$_edge signal 206 XOR amp_clk/2 signal 204, and which is shown to have a frequency equal to (3*FREQ_A)/2), the THD, the out-of-band noise, and the PSRR of the amplifier 102 are not adversely effected.

Figure 4:
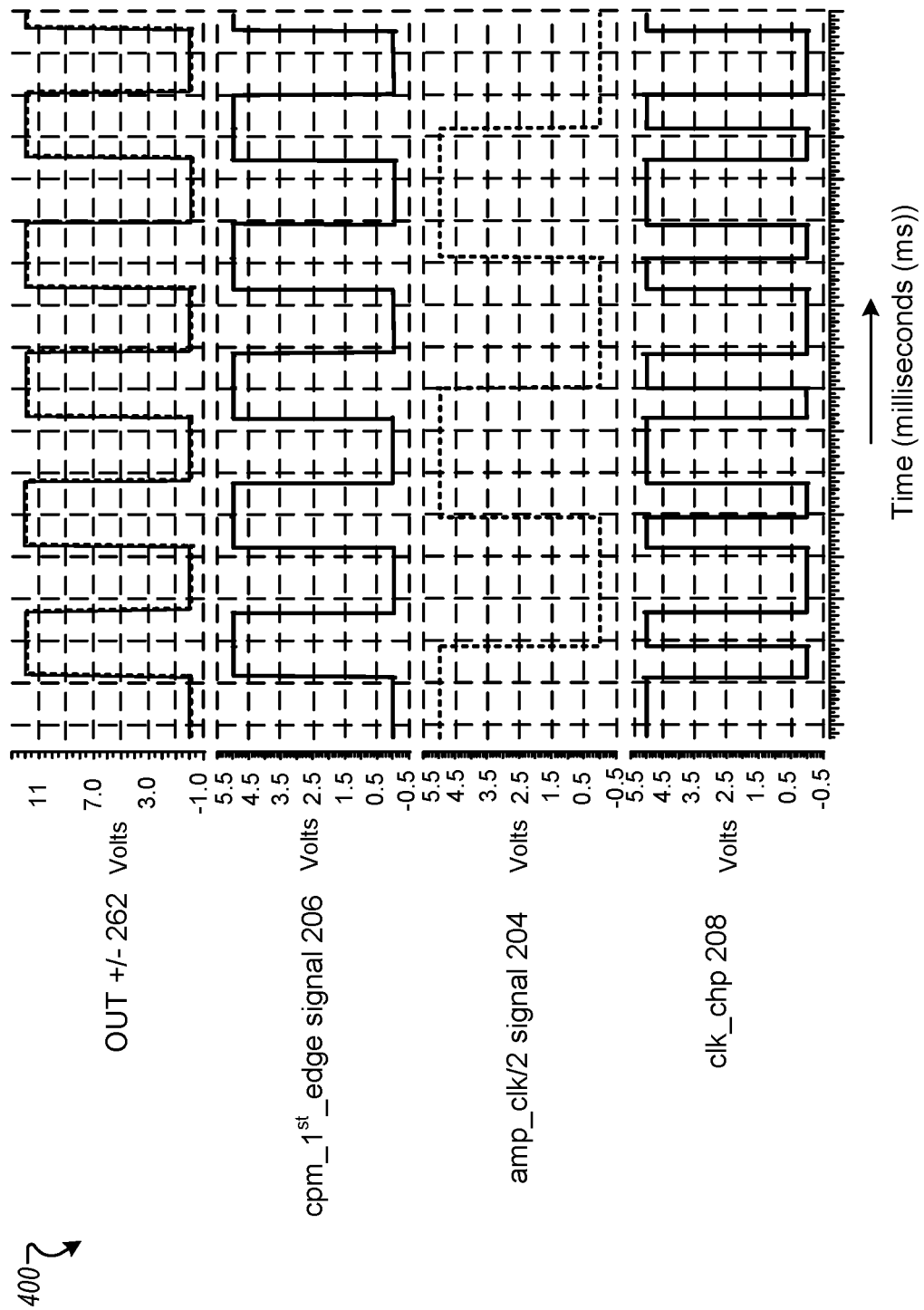
FIG. 4 is a timing chart that shows example signals for a chopper clock circuit in a graph of voltage in volts versus time.

FIG. 4 is a timing chart 400 that shows example signals for a chopper clock circuit (e.g., the chopper clock circuit 106 as shown in FIGS. 1A-B) in a graph of voltage in volts (V) versus time (e.g., which can be in the millisecond (ms) range in some implementations). Referring further to FIG. 2B, the chart 400 is a graph of the voltage versus frequency for the signals OUT+/−262, cmp_1$^{st}$_edge signal 206, amp-_clk/2 signal 204, and the clk_chp 208. The example signals for a chopper clock circuit shown in the chart 400 are for use in the circuit 100 when the circuit 100 produces a low amplitude signal (e.g., at or below 12 volts).

Figure 5:
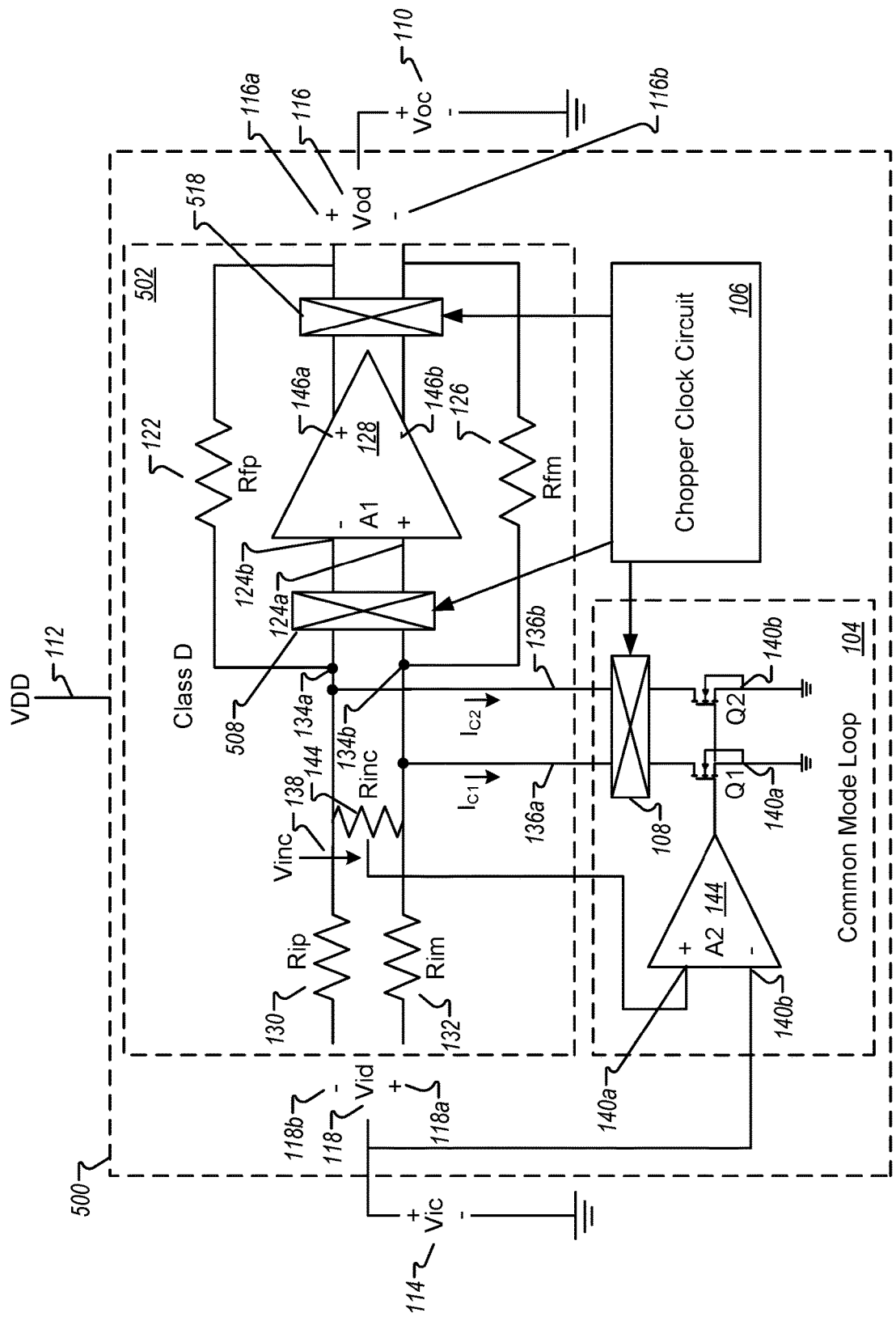
FIG. 5 is a block diagram of an example circuit that shows circuitry included in an alternative implementation of a class D fully differential amplifier circuit and a common mode loop circuit.

FIG. 5 is a block diagram of an example circuit 500 that shows circuitry included in an alternative implementation of a class D fully differential amplifier circuit 502 and the common mode loop circuit 104. Circuitry included in the chopper clock circuit 106 is described with reference to FIG. 2A. The example circuit 500 can also be referred to as a system.

Referring further to FIG. 1B, the alternative implementation of a class D fully differential amplifier circuit 502 in FIG. 5 (as compared to the amplifier circuit 102 in FIG. 1B) includes first chopper switches 508 and second chopper switches 518. The first chopper switches 508 can provide front end active filtering to the inputs 124a and 124b of the amplifier A1 128. The second chopper switches 518 can ensure that polarity of the outputs 146a and 146b are maintained when using the chopper switches 508. The first chopper switches 508 and second chopper switches 518 can be clocked using the output provided by the chopper clock circuit 106.

Figure 6:
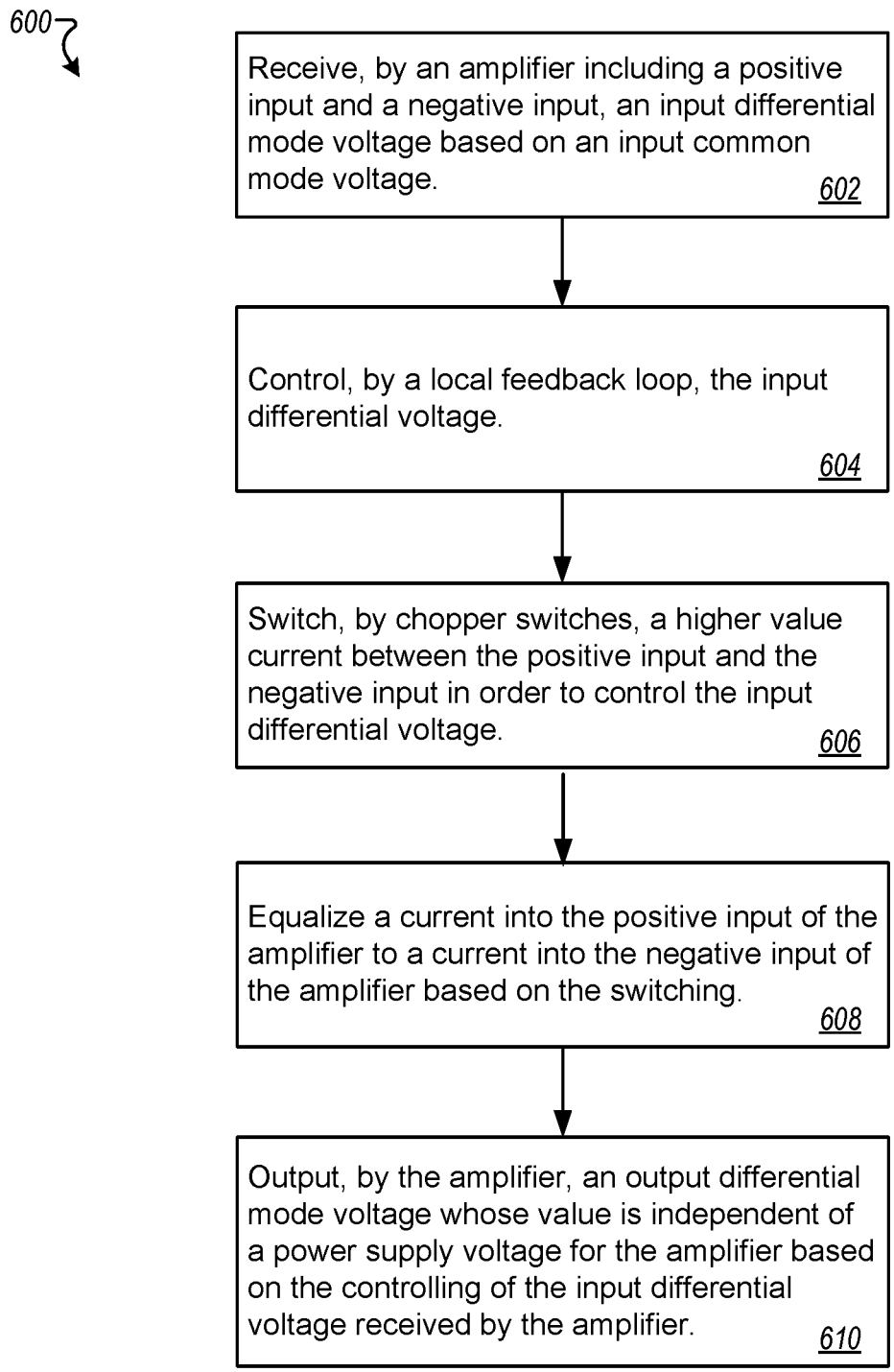
FIG. 6 is a flowchart that illustrates an example method for increasing a power supply rejection ratio (PSRR) for a fully differential amplifier.

FIG. 6 is a flowchart that illustrates an example method 600 for increasing a power supply rejection ratio (PSRR) for a fully differential amplifier. In some implementations, the circuits, devices, systems, and processes described herein can implement the method 600. For example, the method 600 can be described referring to FIGS. 1A-B, 2A-C, and FIGS. 3-5.

An amplifier including a positive input and a negative input can receive an input differential mode voltage based on an input common mode voltage (block 602). For example, the amplifier 128 can receive the input differential mode voltage Vid 118.

A local feedback loop can control the input differential voltage (block 604). For example, the common mode loop output stage 120 (e.g., in FIG. 1A) provided by the common mode loop circuit 104 can be chopped using the chopper switches 108 in order to reduce (or in some cases eliminate) mismatch of feedback resistors included in the feedback paths (e.g., feedback resistors Rfp 122 and Rfm 126 in FIG. 1B).

Controlling the input differential voltage can include switching, by chopper switches, a higher value current between the positive input and the negative input (block 606). For example, the common mode loop output stage 120 can be chopped using the chopper switches 108 in order to reduce (or in some cases eliminate) mismatch of feedback resistors included in the feedback paths.

Controlling the input differential voltage can include, based on the switching, equalizing a current into the positive input of the amplifier to a current into the negative input of the amplifier (block 608), equalizing a current into the positive input of the amplifier to a current into the negative input of the amplifier based on the switching. For example, the chopper switches 108 can switch the higher value current between the positive input 124a and the negative input 124b of the amplifier A1 128. This switching can keep the current into each of the positive input 124a and the negative input 124b of the amplifier A1 128 essentially equal.

The amplifier can output an output differential mode voltage whose value is independent of a power supply voltage for the amplifier based on the controlling of the input differential voltage received by the amplifier (block 610). For example, the common mode loop circuit 104 can provide a common mode loop output stage that can reduce (or in some cases eliminate) the dependency of the Voc 110 on VDD 112, limiting the power supply dependent aspect of the common mode voltage to differential mode voltage conversion to the mismatch of the feedback resistors included in the feedback paths.

In a general aspect, a system can include a fully differential amplifier circuit including a first amplifier, a first feedback path, and a second feedback path. The first feedback path can provide a feedback path from a positive output of the first amplifier to a negative input of the first amplifier. The second feedback path can provide a feedback path from a negative output of the first amplifier to a positive input of the first amplifier. The system can also include a chopper clock circuit configured to output a chopper clock signal at a variable duty cycle. The system can further include a common mode loop circuit including a second amplifier and chopper switches. The common mode loop circuit can be configured to provide a local feedback loop for the first amplifier. The chopper switches can be configured to receive the chopper clock signal from the chopper clock circuit and configured to control a current flow into the positive input of the first amplifier and into the negative input of the first amplifier.

Implementations can include one or more of the following features. For example, a power supply rejection ratio for the first amplifier can be dependent on a mismatch between a resistance of the first feedback path and a resistance of the second feedback path. The first amplifier can be a class D amplifier and the system can be included in an audio amplifier.

The chopper switches can be first chopper switches, and the system can include second chopper switches configured to receive the chopper clock signal. The second chopper switches can be coupled with the positive input of the class D amplifier and the negative input of the class D amplifier, and, based on the chopper clock signal, can filter respective signals applied to the positive input of the class D amplifier and the negative input of the class D amplifier. The system can include third chopper switches configured to receive the chopper clock signal. The third chopper switches can be coupled with the positive output of the class D amplifier and the negative output of the class D amplifier, and, based on the chopper clock signal, can control respective polarities of an output signal of positive output of the class D amplifier and the negative output of the class D amplifier.

The chopper clock signal can be based on at least one of an amplifier clock signal, the positive output of the first amplifier, or the negative output of the first amplifier.

The chopper clock circuit can be configured to change the variable duty cycle of the chopper clock signal instantaneously. A frequency of the chopper clock signal can be variable. A duty cycle of an average of the chopper clock signal over two cycles of an amplifier clock signal can be fifty percent.

The second amplifier can be configured to force a common mode voltage at the negative input of the first amplifier and at the positive input of the first amplifier to be equal to a constant voltage that is independent of a power supply voltage of the system. A first input to the second amplifier can be the constant voltage and a second input to the second amplifier can be a voltage representative of a common mode shift across a first input resistor and a second input resistor.

The first input resistor can be connected to the negative input of the first amplifier and the second input resistor can be connected to the positive input of the first amplifier. The second amplifier can be configured to sense a difference between the input common mode voltage and the voltage representative of the common mode shift across the first input resistor and the second input resistor.

The chopper switches can selectively switch a current flow into the positive input of the first amplifier and into the negative input of the first amplifier in order to equalize a current flow into each of the positive input of the first amplifier and the negative input of the first amplifier.

In another general aspect, a fully differential amplifier circuit can include a class D amplifier configured to receive an input differential mode voltage and output an output differential mode voltage based on an input common mode voltage. The fully differential amplifier circuit can also include a first feedback resistor connected between a positive output of the class D amplifier and a negative input of the class D amplifier, and a second feedback resistor connected between a negative output of the class D amplifier and a positive input of the class D amplifier. The fully differential amplifier circuit can further include a first input resistor connected to the first feedback resistor and the negative input of the class D amplifier, and a second input resistor connected to the second feedback resistor and the positive input of the class D amplifier. The fully differential amplifier circuit can still further include a local feedback loop forcing a common mode voltage at the positive input and the negative input of the class D amplifier to be equal to a constant voltage that is independent of a power supply voltage of the fully differential amplifier. The output differential mode voltage can be based on a mismatch between the first feedback resistor and the second feedback resistor.

Implementations can include one or more of the following features. For example, the local feedback loop can include a feedback loop amplifier configured to sense a difference between the input common mode voltage and a voltage representative of a common mode shift across the first input resistor and the second input resistor. The local feedback loop can include chopper switches configured to control a current flow into the positive input of the class D amplifier and into the negative input of the class D amplifier. Controlling the current flow can include equalizing the current flow into the positive input of the class D amplifier and into the negative input of the class D amplifier.

In another general aspect, a method can include receiving, by an amplifier including a positive input and a negative input, an input differential mode voltage based on an input common mode voltage. The method can also include controlling, by a local feedback loop, the input differential voltage. The controlling can include switching, by chopper switches, a higher value current between the positive input and the negative input, and, based on the switching, equalizing a current flow into the positive input of the amplifier to a current flow into the negative input of the amplifier. The method can further include, based on the controlling of the input differential voltage received by the amplifier, outputting, by the amplifier, an output differential mode voltage that is independent of a power supply voltage for the amplifier.

Implementations can include one or more of the following features. For example, the switching, by the chopper switches, can be controlled by a variable duty cycle clock signal. The switching, by the chopper switches, can include selectively switching a current flow into the positive input of the amplifier and into the negative input of the amplifier in order to equalize the respective current flows into each of the positive input of the amplifier and the negative input of the amplifier.

In another general aspect, a system can include a fully differential amplifier circuit including a class D amplifier, a first feedback path, and a second feedback path. The first feedback path can provide a feedback path from a positive output of the class D amplifier to a negative input of the class D amplifier. The second feedback path can provide a feedback path from a negative output of the class D amplifier to a positive input of the class D amplifier. The system can further include a chopper clock circuit configured to output a chopper clock signal at a variable duty cycle. The system can also include first chopper switches configured to receive the chopper clock signal and second chopper switches configured to receive the chopper clock signal. The first chopper switches can be coupled with the positive input of the class D amplifier and the negative input of the class D amplifier, and, based on the chopper clock signal, can filter respective signals applied to the positive input of the class D amplifier and the negative input of the class D amplifier. The second chopper switches can be coupled with the positive output of the class D amplifier and the negative output of the class D amplifier, and, based on the chopper clock signal, can control respective polarities of an output signal of positive output of the class D amplifier and the negative output of the class D amplifier.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit comprising:
    an amplifier circuit including a first amplifier, a first feedback path, and a second feedback path, the first feedback path providing a feedback path from a positive output of the first amplifier to a negative input of the first amplifier and the second feedback path providing a feedback path from a negative output of the first amplifier to a positive input of the first amplifier; and
    a loop circuit including a second amplifier, the loop circuit being configured to provide a local feedback loop for the first amplifier and configured to control current flow into the positive input of the first amplifier and into the negative input of the first amplifier.

2. The circuit of claim 1, further comprising:
    a chopper clock circuit configured to output a chopper clock signal at a variable duty cycle,
    the loop circuit further including chopper switches, the chopper switches being configured to receive the chopper clock signal from the chopper clock circuit and control the current flow into the positive input of the first amplifier and into the negative input of the first amplifier.

3. The circuit of claim 2, wherein the chopper switches are first chopper switches, the circuit further comprising:
    second chopper switches configured to receive the chopper clock signal, the second chopper switches:
        being coupled with the positive input of the first amplifier and the negative input of the first amplifier; and
        based on the chopper clock signal, filtering respective signals applied to the positive input of the first amplifier and the negative input of the first amplifier.

4. The circuit of claim 3, further comprising:
    third chopper switches configured to receive the chopper clock signal, the third chopper switches:
        being coupled with the positive output of the first amplifier and the negative output of the first amplifier; and
        based on the chopper clock signal, control respective polarities of an output signal of the positive output of the first amplifier and the negative output of the first amplifier.

5. The circuit of claim 2, wherein the chopper clock signal is based on at least one of an amplifier clock signal, the positive output of the first amplifier, or the negative output of the first amplifier.

6. The circuit of claim 2, wherein a frequency of the chopper clock signal is variable.

7. The circuit of claim 2, wherein the chopper switches selectively switch a current flow into the positive input of the first amplifier and into the negative input of the first amplifier in order to equalize a current flow into each of the positive input of the first amplifier and the negative input of the first amplifier.

8. The circuit of claim 1, wherein a power supply rejection ratio for the first amplifier is dependent on a mismatch between a resistance of the first feedback path and a resistance of the second feedback path.

9. The circuit of claim 1, wherein the first amplifier is a class D amplifier.

10. The circuit of claim 1, wherein the amplifier circuit is a fully differential amplifier circuit.

11. The circuit of claim 1, wherein the second amplifier is configured to force a voltage at the negative input of the first amplifier and at the positive input of the first amplifier to be equal to a constant voltage that is independent of a power supply voltage of the circuit.

12. The circuit of claim 11 wherein a first input to the second amplifier is the constant voltage and a second input to the second amplifier is a voltage representative of a voltage shift across a first input resistor and a second input resistor.

13. The circuit of claim 12, wherein the first input resistor is connected to the negative input of the first amplifier and the second input resistor is connected to the positive input of the first amplifier.

14. A differential amplifier circuit comprising:
- a differential amplifier configured to receive an input differential mode voltage and output an output differential mode voltage based on an input voltage;
- a first feedback resistor connected between a positive output of the differential amplifier and a negative input of the differential amplifier;
- a second feedback resistor connected between a negative output of the differential amplifier and a positive input of the differential amplifier;
- a first input resistor connected to the first feedback resistor and the negative input of the differential amplifier; and
- a second input resistor connected to the second feedback resistor and the positive input of the differential amplifier, a local feedback loop forcing the input voltage at the positive input and the negative input of the differential amplifier to be equal to a constant voltage that is independent of a power supply voltage of the differential amplifier circuit;
- the output differential mode voltage being based on a mismatch between the first feedback resistor and the second feedback resistor.

15. The differential amplifier circuit of claim 14, wherein the local feedback loop includes a feedback loop amplifier configured to sense a difference between the input voltage and a voltage representative of a voltage shift across the first input resistor and the second input resistor.

16. The differential amplifier circuit of claim 15, wherein the local feedback loop further includes chopper switches configured to control current flow into the positive input of the differential amplifier and into the negative input of the differential amplifier.

17. The differential amplifier circuit of claim 16, wherein controlling the current flow includes equalizing the current flow into the positive input of the differential amplifier and into the negative input of the differential amplifier.

18. A method comprising:
- receiving, by an amplifier including a positive input and a negative input, an input differential voltage based on an input voltage;
- controlling, by a local feedback loop, the input differential voltage, the controlling including:
  - switching a higher value current between the positive input and the negative input; and
  - based on the switching, equalizing a current flow into the positive input of the amplifier to a current flow into the negative input of the amplifier; and
- based on the controlling of the input differential voltage received by the amplifier, outputting, by the amplifier, an output differential mode voltage that is independent of a power supply voltage for the amplifier.

19. The method of claim 18, wherein the switching is controlled by a variable duty cycle clock signal.

20. The method of claim 19, wherein the switching includes selectively switching a current flow into the positive input of the amplifier and into the negative input of the amplifier in order to equalize the respective current flows into each of the positive input of the amplifier and the negative input of the amplifier.

* * * * *